United States Patent [19]

Agee et al.

[11] Patent Number: 4,807,441
[45] Date of Patent: Feb. 28, 1989

[54] COOLING SYSTEM FOR A SEALED ENCLOSURE

[75] Inventors: Keith D. Agee, Torrance; Fredrik E. Faulkner, Rolling Hills Estates, both of Calif.

[73] Assignee: Allied-Signal Inc., Morristown, N.J.

[21] Appl. No.: 74,827

[22] Filed: Jul. 17, 1987

[51] Int. Cl.⁴ .................................... F25B 21/02
[52] U.S. Cl. .................................... 62/3
[58] Field of Search ............................. 62/3

[56] References Cited

U.S. PATENT DOCUMENTS

| | | | |
|---|---|---|---|
| 3,040,539 | 6/1962 | Gaugler | 62/3 |
| 3,138,934 | 6/1964 | Roane | 62/3 |
| 3,194,024 | 7/1965 | Bassett, Jr. | 62/3 |
| 3,212,274 | 10/1965 | Eidus | 62/3 |
| 3,232,063 | 2/1966 | Eichhorn et al. | 62/3 |
| 3,314,242 | 4/1967 | Lefferts | 62/3 |
| 3,821,881 | 7/1974 | Harkias | 62/3 |
| 3,823,567 | 7/1974 | Conini | 62/3 |
| 3,833,837 | 9/1974 | West | |
| 3,956,673 | 5/1976 | Seld | |
| 3,993,123 | 11/1976 | Chu et al. | |
| 4,177,499 | 12/1979 | Volkmann | |
| 4,270,604 | 6/1981 | Masakaza | |
| 4,467,611 | 8/1984 | Nelson et al. | 62/3 |
| 4,449,164 | 5/1984 | Carlson et al. | |
| 4,500,944 | 2/1985 | Roberts et al. | |
| 4,513,812 | 4/1985 | Papst et al. | |
| 4,520,425 | 5/1985 | Ito | |
| 4,535,386 | 8/1985 | Frey et al. | |

Primary Examiner—Lloyd L. King
Attorney, Agent, or Firm—Ken C. Decker

[57] ABSTRACT

A cooling system for a sealed enclosure having heat generating equipment therein characterized by force convection indirect cooling of the heat generating equipment combined with a natural convention external finned heat sink. The cooling system or heat exchanger is mounted to the wall of the sealed enclosure and includes two side plates which are mounted a spaced distance from one another. One side plate forms a portion of a wall of the sealed enclosure and has fin elements mounted on one side, which side is outside of the enclosure. Fin elements are mounted between the two side plates extending inwardly from opposing ends of the side plates a desired distance thereby forming a central plenum between the two sets of fin elements. A fan is mounted in a manner to drawn air in between the side plates and return it to the enclosed environment.

8 Claims, 2 Drawing Sheets

COOLING SYSTEM FOR A SEALED ENCLOSURE

BACKGROUND OF THE INVENTION

The present invention relates to a heat exchanger and more particularly to a heat exchanger which combines forced convection indirect cooling of internal electrical components with a natural convection external finned heat sink.

In general, high power density electrical circuitry generates a large amount of heat and requires a cool, clean environment in order to function properly and reliably. Therefore, it is necessary to dissipate the generated heat so as to use the circuitry in the manner intended, thereby lengthening the life of each component and increasing their reliability. Isolating the components from the environment eliminates moisture and dust, but greatly complicates the cooling of the circuitry since the components cannot be cooled directly. Therefore, there is a need for a suitable apparatus which can cool electrical circuitry which is isolated from the environment.

SUMMARY OF THE INVENTION

It is an object of the present invention to provide a means for cooling electrical circuitry which is isolated from the environment.

It is another object of the present invention to provide a heat exchanger apparatus which combines forced convection indirect cooling of the electrical circuitry with a external finned heat sink cooled by natural convection.

It is a further object of the present invention to provide a cooling apparatus which can prolong the life of electrical circuitry and increase its reliability.

It is a still further object of the present invention to provide a heat exchanger apparatus which combines forced convection indirect cooling of electrical circuitry with natural convection cooling passages sandwiched between finned hot passages.

In accordance with the present invention the cooling system for sealed enclosures is used in association with a sealed container having a heat generating source therein. The cooling system or heat exchanger is formed as part of one or more of the walls of the sealed enclosure and includes a first and a second side plate which are mounted in spaced, generally parallel relationship to each other. Fin elements are mounted between at least a portion of the two side plates and their ends define the boundary of a central plenum area between the side plates and the fin elements. A fan is mounted to the first side plate over the central plenum in order to draw hot enclosure air between the two side plates. The air flows through passageways formed by the fin elements and enters into the central plenum before being drawn through the fan. The outer face of the second side plate has a plurality of spaced fins or ribs attached to form a finned wall section outside of the enclosure. The second side plate is mounted so that it forms wither all or a portion of a wall of the sealed enclosure.

BRIEF DESCRIPTION OF THE DRAWINGS

These and other objects of the present invention will become more readily apparent from the following specification, with reference to the accompanying drawings, in which.

DESCRIPTION OF THE PREFERRED EMBODIMENTS

Figure 1:
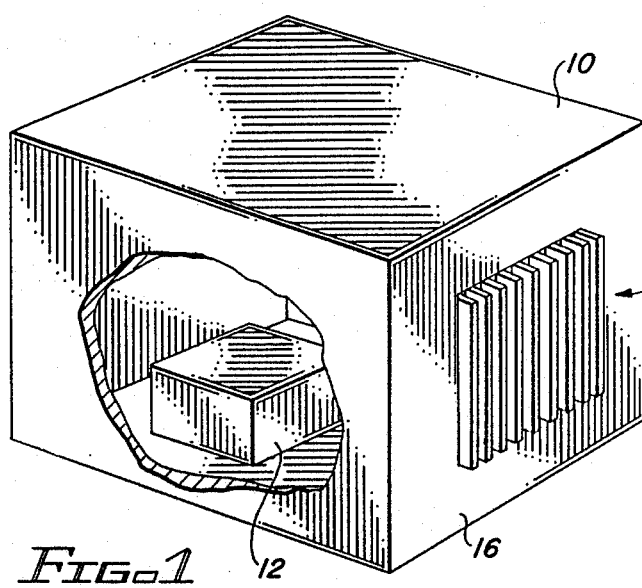
FIG. 1 is a perspective view of the cooling system for a sealed enclosure according to the present invention.

FIG. 1 illustrates a sealed enclosure 10 which includes a heat generating source 12, such as electrical circuitry, and a cooling system or a heat exchanger 14. The heat exchanger 14 can be formed either as a portion of one wall 16 of the enclosure 10 or the wall itself or several heat exchangers can be mounted to one wall or several of the walls of the enclosure.

The heat exchanger 14 is shown in greater detail in FIGS. 2-6. As shown, the heat exchanger comprises a first and a second side plate, 22 and 24 respectively, which are in generally spaced parallel relationship. Located between the two side plates are heat exchange fin elements 26, which together with the two side plates define a plurality of air passageways 28 therebetween. Heat exchange fin elements 26 can be individual fins or more likely formed as part of a corrugated sheet which is placed between the two side plates and thereafter bonded together. As shown, the passageways 28 extend horizontally inward from the opposing ends of the heat exchanger 14 and each terminates a desired distance from the edge of the side plate, thereby forming a central plenum 30 which is bounded by the two side plates 22 and 24 and the termination of the heat exchange fin elements 26. In this manner, in the preferred embodiment, there is a finned portion 27 on either side of the plenum 30. A bar or flange 40 is attached to each side plate at the top and bottom of the first side plate. Flange 40 can also be formed integral to first side plate 22 as is explained below. A fan 32 is mounted to the inner face of the first side plate 22 and is therefore located within the sealed enclosure 10. Side plate 22 includes an opening 31 to accommodate the fan 32, thereby allowing air flow from the central plenum 30 to be drawn into the fan 32.

The second side plate 24 forms a portion of the wall of the sealed enclosure 10. As shown, a plurality of ribs or fins 36 are attached to the outer face of second side plate 24. These fins 36 are shown to be arranged in parallel relationship and extending in the vertical direction though any desired spacing and arrangement can be used to achieve the necessary heat transfer to the environment. However, ribs 36 extending in the vertical direction utilize the differential of air densities between hot and cool air to set up air circulation up through the ribs. As noted above, the heat exchanger 14 and in particular second side plate 24 can form a portion of wall 16 or can form the wall itself. Furthermore, if greater heat dissipation is necessary, several heat exchangers 14 can be used with a single sealed enclosure 10. Hence, the heat exchanger 14 can be formed and thereafter mounted within the allotted opening in the sealed enclosure.

It is to be noted that while the preferred embodiment of FIGS. 2-5 show that the plenum 30 is lcoated between two finned portions 27, it could be located entirely to one side of the finned portion or at the top or bottom of the finned portion.

Figure 6:
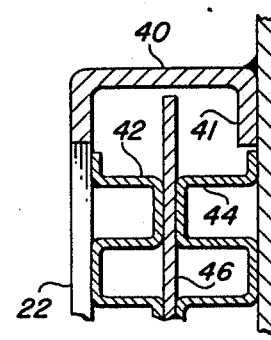
FIG. 6 is a partial view of the design of the side plates and detailing an alternative heat exchanger fin element configuration located between the two side plates.
Figure 5:
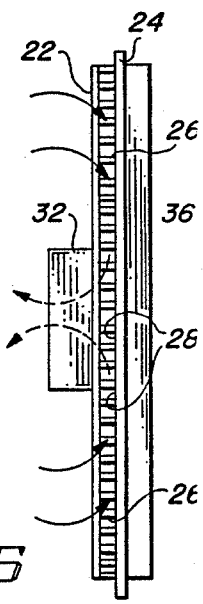
FIG. 5 is a side view of the heat exchanger.
Figure 4:
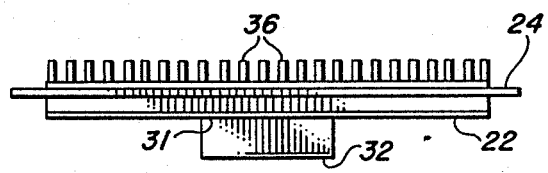
FIG. 4 is a top view of the heat exchanger.
Figure 3:
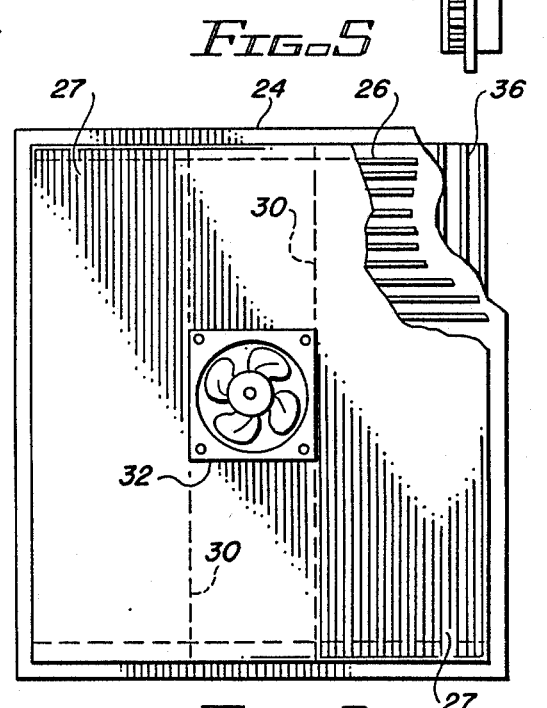
FIG. 3 is a front view of the heat exchanger including several cut-out portions.

FIG. 6 details an alternate design of the finned portions 27 of heat exchanger 14. As shown, the first side plate 22 includes the flange 40 having an integral tab member 41 attached to the top and bottom edge thereof. The flange 40 is bent approximately perpendicular to side plate 22 and tab member 41 is formed so that it is approximately perpendicular to the flange 40 and parallel to side plate 22. This design provides for ease of braxing or welding tab members 41 of the first side plate 22 to the second side plate 24. As shown in FIG. 6, each of the finned portions 27 comprises two corrugated fin elements 42 and 44 having a thin-walled plate 46 therebetween. The design can be changed in order to meet the heat transfer characteristics necessary to cool the air held within the enclosure.

Figure 7:
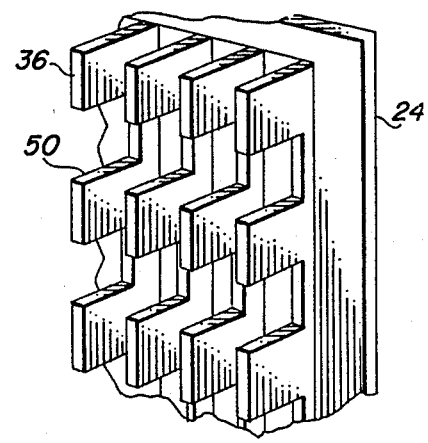
FIG. 7 is a partial view of an alternative design of the fins or ribs attached to the second side plate.
Figure 2:
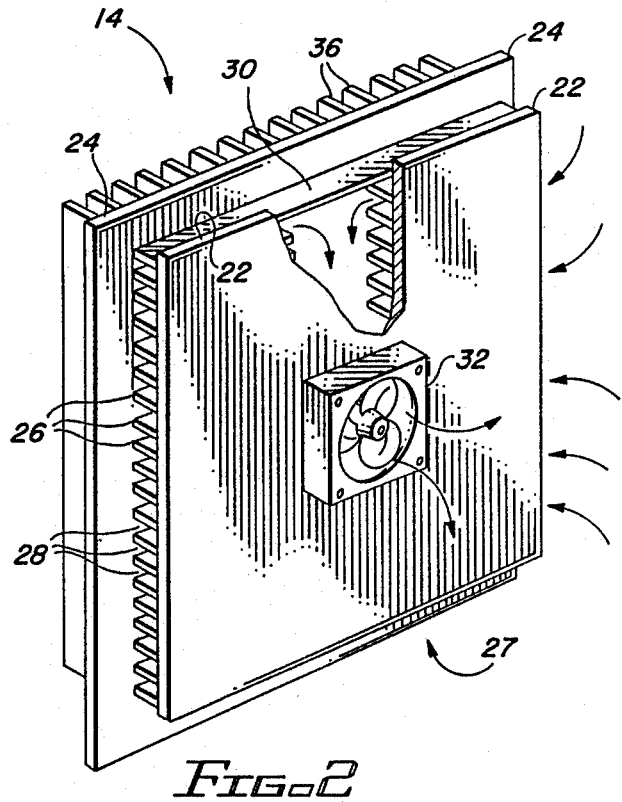
FIG. 2 is a enlarged perspective view of the heat exchanger of the cooling system with a cut out section to show the central plenum.

FIG. 7 details an alternative design for the fins 36 which are attached to the outer face of second side plate 24 and are therefore located outside the enclosure 10. As stated above, the fins are preferably arranged vertically in order to allow the hotter air to rise thereby creating circulation of ambient air. However, in order to increase the heat transfer to the ambient air, the fins 36 are formed with cutouts 50 which increase the air turbulence flowing between adjacent fins 36.

Upon operation of the heat generating source 12 in the sealed enclosure 10, heat is dissipated to the air therein, which is drawn by the fan 32 through the passageways 28 formed by heat exchange fin elements 26 on each side of the heat exchanger 14. The relatively hot enclosure air gives up some of the heat by forced convection to the heat exchange fin elements 26 which in turn conduct the heat to the ribs or fins 36 attached to the second side plate 24. The heat is in turn transmitted to the environment by natural convection and radiation. The relatively cool enclosure air exiting the passageways 28 enters the central plenum 30 and is thereafter drawn into the fan 32 and returned to an area of the sealed enclosure 10 having relative hot enclosure air. At steady state operation of the heat generating source, all of the heat produced by the heat generating source 12 and fan 32 will be transmitted to the environment via the fins 36.

Figure 8:
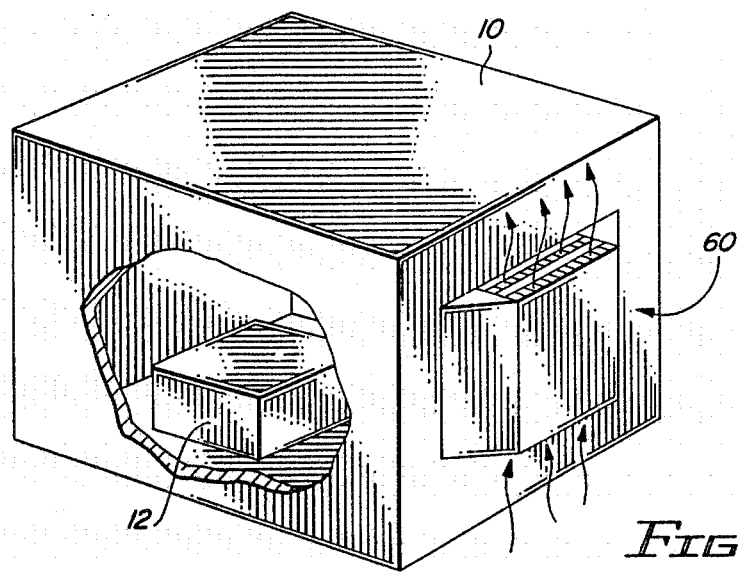
FIG. 8 is a perspective view of an alternative embodiment of the cooling system of the present invention.
Figure 9:
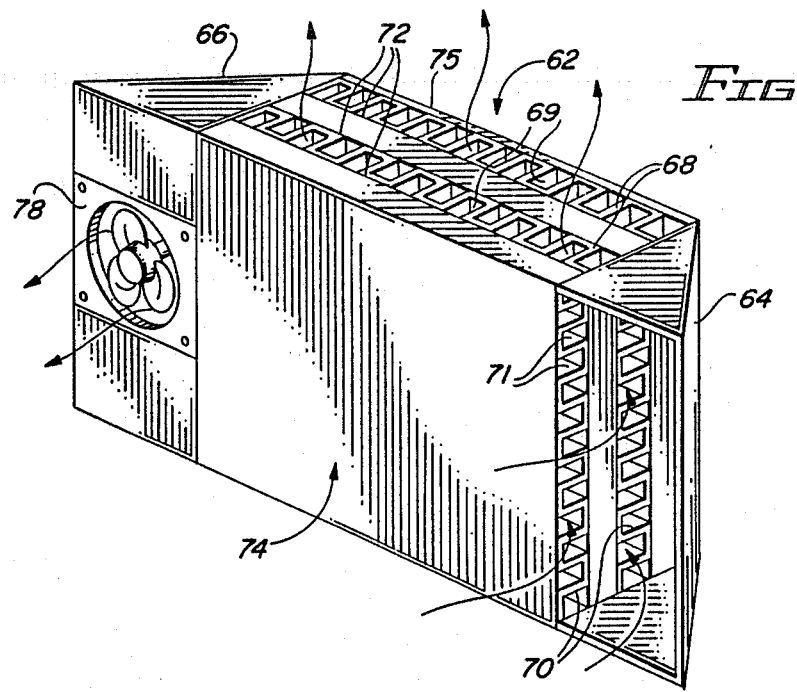
FIG. 9 is an enlarged perspective view of the alternative embodiment of the cooling system as shown in FIG. 8.

FIGS. 8 and 9 show an alternative embodiment of the cooling system of the present invention. As shown, the cooling system 60 operates using the same principles as in the case of the preferred embodiment. These principles are forced convention indirect cooling of the heat generating equipment combined with a natural convection external finned heat sink.

In this embodiment, the cooling system 60 includes a heat exchanger core 62 having an inlet and outlet manifold 64 and 66 respectively at opposite ends thereof. The heat exchanger core is of the cross-flow type having alternating channels of perpendicular directions of flow. The core 62 comprises plate-fin elements 68 which are oriented in an alternating stack or array with plate fin elements 70 and the stacked plate-fin elements 68 and 70 are separated from each other by a plurality of relatively thin end and lightweight divider plates 72 of a heat conductive material such as copper or aluminum. The plate-fin elements 68 and 70 form a plurality of air passages, 69 and 71 respectively, within the alternating channels, which channels are sealed from adjacent channels.

The entire stack including the plate-fin elements 68 and 70 and the divider plates 72 is in turn sandwiched between a pair of protective side plates 74 and 75. These side plates are also formed of a heat conductive material. As drawn, there are only two sets of plate-fin elements 68 and 70, however, it should it understood that any number could be used depending on size and the amount of heat to be dissipated.

Manifolds 64 and 66 are shown to be triangular in cross-section but can be formed into any design which leads the air into and out of the heat exchanger core 62. The outlet manifold 66 includes a fan 78. The outlet manifold is sealed except for an opening for the fan 78 such that all air drawn in hte inlet manifold 64 passes through the fan 78.

As with the preferred embodiment, the relatively hot enclosure air is drawn through the heat exchanger core 62 where it transfers its heat to the corrugated fin elements 70 which in turn conduct it to the cooler core surfaces. Outside of the sealed enclosure, cooler environmental air passes upwardly through the vertically extending passages 69. Through natural convection the heat is thereafter transferred to the environmental air. This gradual increase in air temperature will induce a flow of cool air into the bottom of the passages 69, thereby continuously circulating environmental air into the core.

Various modifications to the depicted and described apparatus will be apparent to those skilled in the art. Accordingly, the foregoing detailed description of the preferred emobidment should be considered exemplary in nature and not as limiting to the scope and spirit of the invention as set forth in the appended claims:

We claim:

1. A cooling system for a sealed enclosure having a heat generating source therein:

means, within said sealed enclosure, for cooling the heat generating source by indirect forced convection;

means, external to said sealed environment, for dissipating said heat to the environment by natural convection;

said means for cooling comprising heat exchanger means for absorbing heat from the air within said sealed enclosure, and means for drawing air through said heat exchanger means, said heat exchanger comprising a first and a second side plate, said first side plate forming a portion of the enclosure walls, a plurality of alternating cross-flow channels sealingly separated from adjacent channels and extending in parallel relationship with said side plates, inlet manifold means for directing enclosure air into alternative channels, and outlet manifold means for collecting the enclosure air.

2. The system of claim 1 wherein said heat exchanger means comprises:

a second side plate;

a flange member secured between said two side plates along the top and bottom edge of said side plates thereby securing and spacing said side plates a fixed distance from one another and defining a plenum therebetween; and heat exchange fin elements located between at least a portion of said side plates, said elements extending into said plenum a desired distance generally parallel to said flange members.

3. The system of claim 2 wherein said flange member includes an integral tab member which extends the length of the flange member and is generally perpendicular thereto, said tab member being secured to one of said side plates.

4. The system of claim 1 wherein said means for drawing air comprises a fan mounted to said outlet manifold means.

5. The system of claim 1 further comprising platefin elements within each of said channel.

6. A cooling system for a sealed enclosure having a heat generating source therein:

means, within said sealed enclosure, for cooling the heat generating source by indirect forced convection;

means, external to said sealed environment, for dissipating said heat to the environment by natural convection;

said cooling means comprising a pair of side plates mounted in parallel spaced relationship thereby forming a plenum therebetween, said first side plate having an opening therein, a flange member secured between said two side plates along the top and bottom edge of at least one side plate, and heat exchange fin elements located between at least a portion of said side plates; said heat exchange fin elements extending inwardly from opposing ends of the plenum a desired distance, said fin elements defining a plurality of horizontally extending passageways which terminate in a central plenum defined by the side plates, the flange members, and innermost ends of said heat exchange fin elements; and a fan mounted to said first side plate over said opening, which opening extends into the central plenum.

7. The system of claim 6 wherein said flange member is formed integral to said first side plate and includes a tab member which extends the length of the flange member and is generally perpendicular thereto, said tab member being secured to said second side plate.

8. The system of claim 7 wherein said heat exchange fin elements comprise a pair of corrugated heat exchange fin elements.

* * * * *